United States Patent [19]

Sullivan et al.

[11] Patent Number: 5,729,148

[45] Date of Patent: Mar. 17, 1998

[54] PROBE ASSEMBLY

[75] Inventors: Joseph M. Sullivan, Wappingers Falls; Emanuele F. Lopergolo, Marlboro, both of N.Y.

[73] Assignee: International Business Machines Corporation, Armonk, N.Y.

[21] Appl. No.: 672,877

[22] Filed: Jun. 28, 1996

[51] Int. Cl.$^6$ ............................................. G01R 31/02
[52] U.S. Cl. .............................. 324/755; 324/754
[58] Field of Search .................... 324/755, 754; 439/540, 541, 542, 543, 540.1, 591; 361/399; 29/825, 842, 844, 845, 854, 874, 884

[56] References Cited

U.S. PATENT DOCUMENTS 4,199,209  4/1980  Cherian et al. .................. 439/591

*Primary Examiner*—Ernest F. Karlsen
*Assistant Examiner*—Anh Phung
*Attorney, Agent, or Firm*—John J. Tomaszewski; Delio & Peterson, LLC; Aziz M. Ahsan

[57] ABSTRACT

A probe assembly comprising a frame and at least one contact carrier within the frame wherein the carrier has a plurality of tie strips and a plurality of contacts and each contact is contiguous with a corresponding group of tie strips. Each contact becomes discontiguous from the corresponding group of tie strips when a force is applied to the tie strips. The probe assembly further comprising at least two rails attached to the frame. Each rail has a top portion for receiving the contacts and tie strips and a bottom portion having a plurality of regions for contacting the tie strips. The carrier is positioned between the top portion of one of the rails and the bottom portion of the other rail. When a compressive force is applied to the rails and carrier, the regions forcibly contact the tie strips such that all the contacts simultaneously become discontiguous from the tie strips.

12 Claims, 4 Drawing Sheets

PROBE ASSEMBLY

BACKGROUND OF THE INVENTION

1. Field of the Invention

The present invention relates generally to a probe assembly.

2. Problem to be Solved

One typical use of a probe assembly is as a test socket. When used as a test socket, a probe assembly acts as a connector interface between a test board and an electronic module. Typically, the test board and the module both have an array of pads on their mating surfaces that provide access to power, ground potential and signal circuits. These pads are usually on a 1.27 mm or 1.00 mm pitch. However, other pitches are also used. The array of pads may consist of any number of pads. Typical array sizes are 17×17, 21×21, 33×33, 47×47, etc.

Conventional probe assemblies typically utilize a plurality of fine probes or contacts that have been individually inserted in the probe assembly. However, individual insertion of the contacts is a time consuming process. Other conventional probe assemblies use strips of contacts wherein each strip is individually inserted in the probe assembly and is locked in place. Again, the process of individually inserting each strip is a time consuming process. Furthermore, the individual insertion of the contacts or strips results in inconsistent location of the contacts thereby creating the possibility of faulty connections between the test board and electronic module. Another conventional probe assembly uses probes or contacts that are soldered into plated throughholes in a circuit board. A further conventional probe assembly uses probes or contacts that are captured between two plates (top and bottom). However, these conventional probe assemblies are also time consuming and costly to assemble. Furthermore, all of the conventional probe assemblies described above have limited flexibility since new molded frames, plates, cards, etc. are required for each array size.

It is therefore an object of the present invention to provide a new and improved probe assembly that may be assembled in relatively less time than conventional probe assemblies.

It is another object of the present invention to provide a new and improved probe assembly that uses a minimum of components.

It is a further object of the present invention to provide a new and improved probe assembly that can be manufactured at lower costs than the conventional probe assemblies.

It is another object of the present invention to provide a new and improved probe assembly that significantly reduces the occurrences of faulty electrical connections between circuit boards.

Still other objects and advantages of the invention will in part be obvious and will in part be apparent from the specification.

SUMMARY OF THE INVENTION

The above and other objects, which will be apparent to those skilled in the art, will be achieved in the present invention which is directed to in a first aspect, a probe assembly comprising a frame and at least one contact carrier within the frame wherein the carrier has a plurality of tie strips and a plurality of contacts and each contact is contiguous with a corresponding group of tie strips. Each contact becomes discontiguous from the corresponding group of tie strips when a force is applied to the tie strips. The probe assembly further comprises at least two rails attached to the frame. Each rail has a top portion for receiving the contacts and tie strips and a bottom portion having a plurality of regions for contacting the tie strips. The carrier is positioned between the top portion of one of the rails and the bottom portion of the other rail. When a compressive force is applied to the rails and carrier, the regions forcibly contact the tie strips such that all the contacts simultaneously become discontiguous from the tie strips.

In a related aspect, the present invention is directed to a probe assembly comprising a frame, a plurality of contact carriers within the frame and a plurality of rails movably mounted to the frame. Each contact carrier having a plurality of tie strips and a plurality of contacts. Each contact is contiguous with a corresponding group of tie strips. Each contact becoming discontiguous from the corresponding group of tie strips when a force is applied to the tie strips. Each rail has a top portion for receiving the contacts and a bottom portion having a plurality of regions for contacting the tie strips. The top portion of each rail further includes a tie strip receiving surface aligned with a corresponding tie strip and region. The carriers and rails being alternately arranged such that each carrier is positioned between the top portion of one of the rails and the bottom portion of another rail. When a compressive force is applied to the rails and carriers, the regions forcibly contact the tie strips such that all the contacts simultaneously become discontiguous from the group of tie strips. The regions and tie strip receiving surfaces are separated by a predetermined amount of space to allow for the removal of the tie strips once each contact becomes discontiguous with the corresponding group of tie strips.

BRIEF DESCRIPTION OF THE DRAWINGS

The features of the invention are believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DESCRIPTION OF THE PREFERRED EMBODIMENTS

In describing the preferred embodiment of the present invention, reference will be made herein to FIGS. 1–4 of the drawings in which like numerals refer to like features of the invention.

The present invention is directed to probe assembly. Although the ensuing discussion pertains to a probe assembly for use as an electronic module test socket, it is to be understood that the probe assembly may be used to implement a broad range of electronic connector and interconnect systems.

Figure 1:
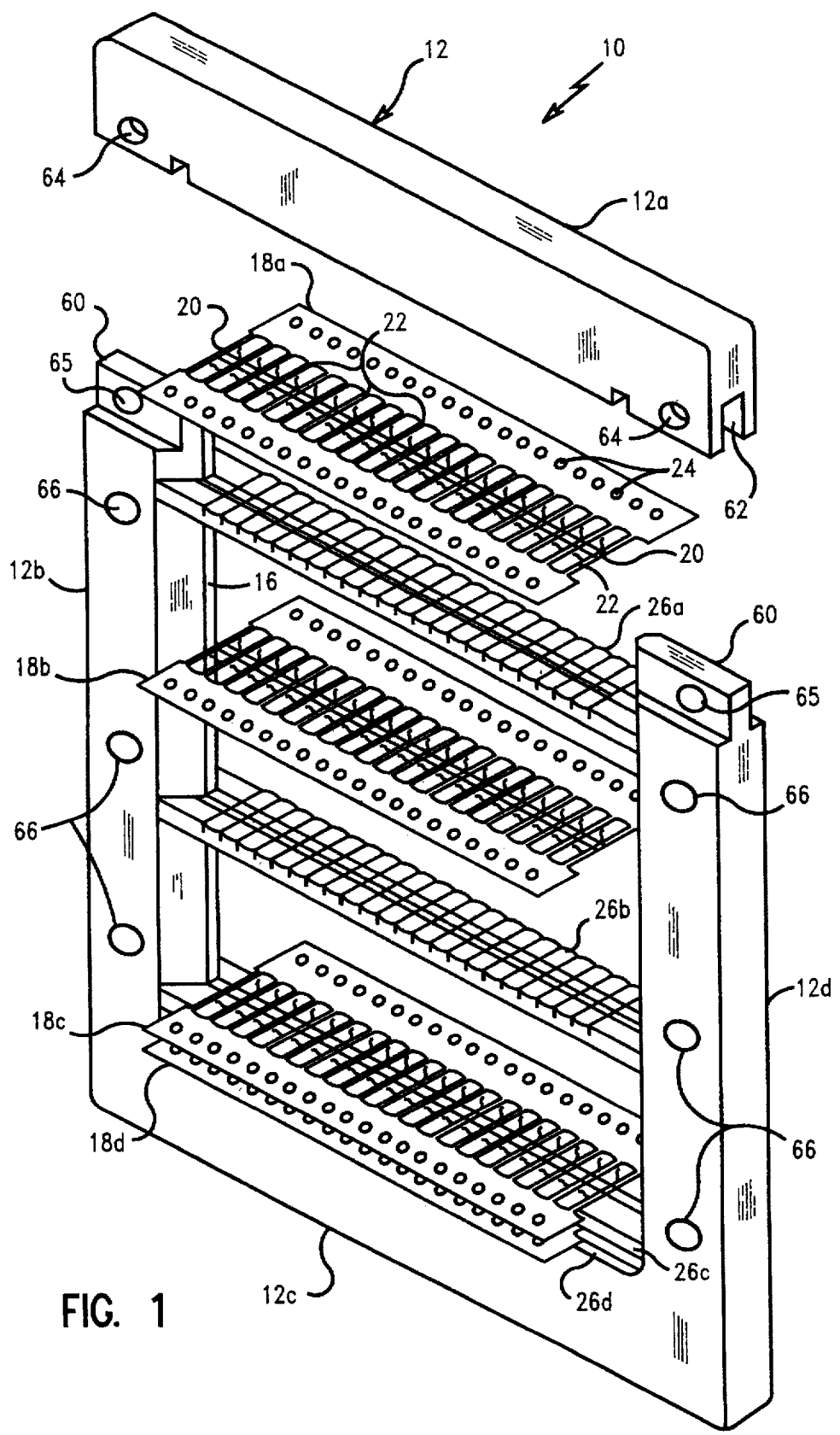
FIG. 1 is a perspective view of the probe system of the present invention.
Figure 2:
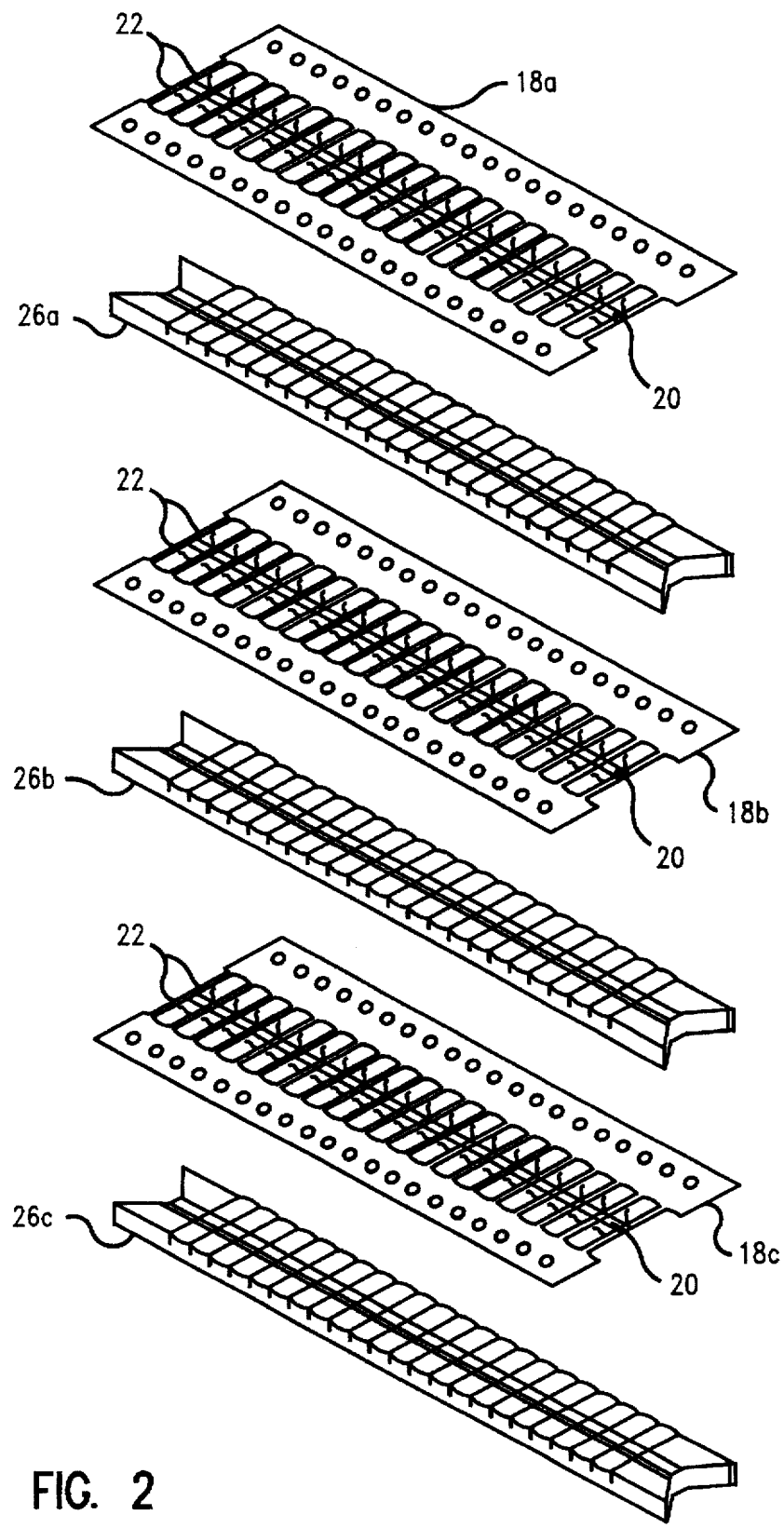
FIG. 2 is an exploded view showing rails and carrier strips depicted in FIG. 1.
Figure 3:
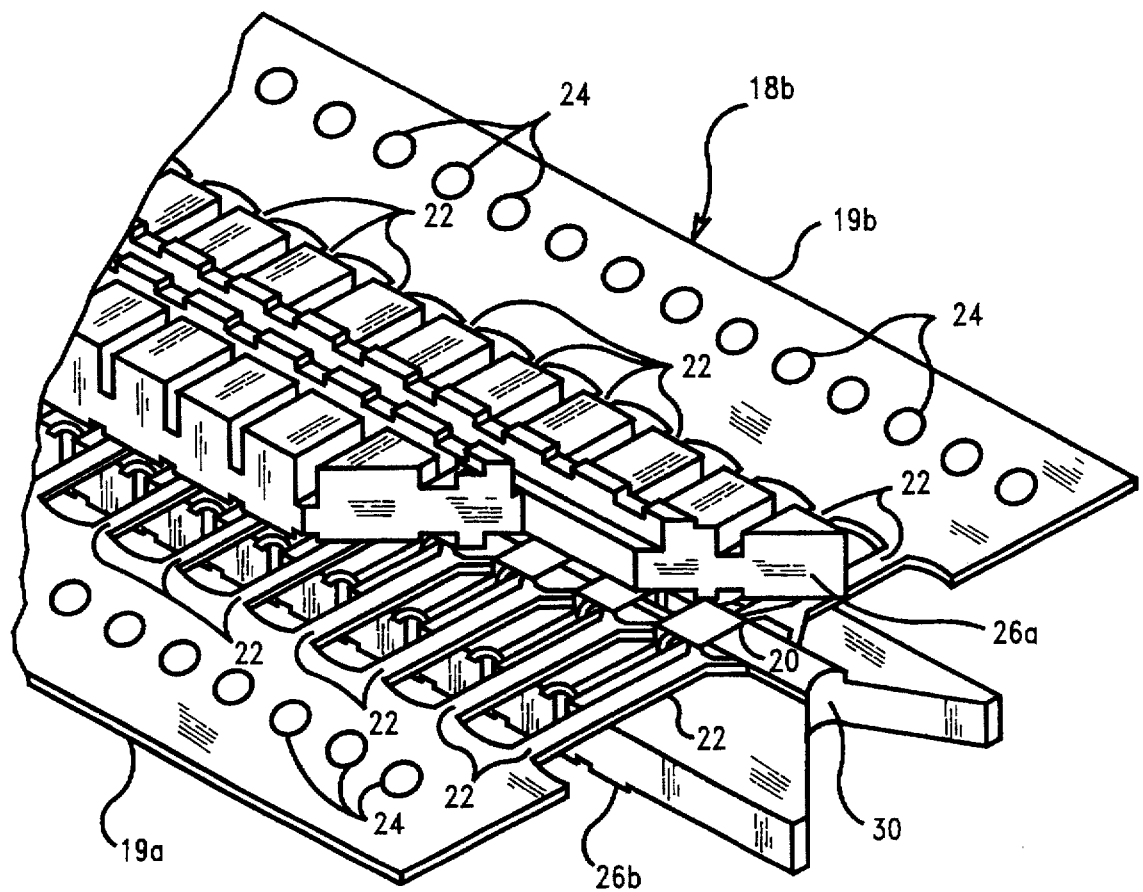
FIG. 3 is a perspective view of one of the carrier strips depicted in FIG. 1 connected between a pair of the rails depicted in FIG. 1.

Referring to FIGS. 1–3, probe assembly 10 of the present invention comprises frame 12, contact carrier strips 18a–d and rails 26a–d. For purposes of this description, four contact carrier strips 18a–d and rails 26a–d are shown. However, it is to be understood that probe assembly 10 may use as few as two (2) rails and one (1) carrier strip or more than four (4) carrier strips and four (4) rails.

Figure 4:
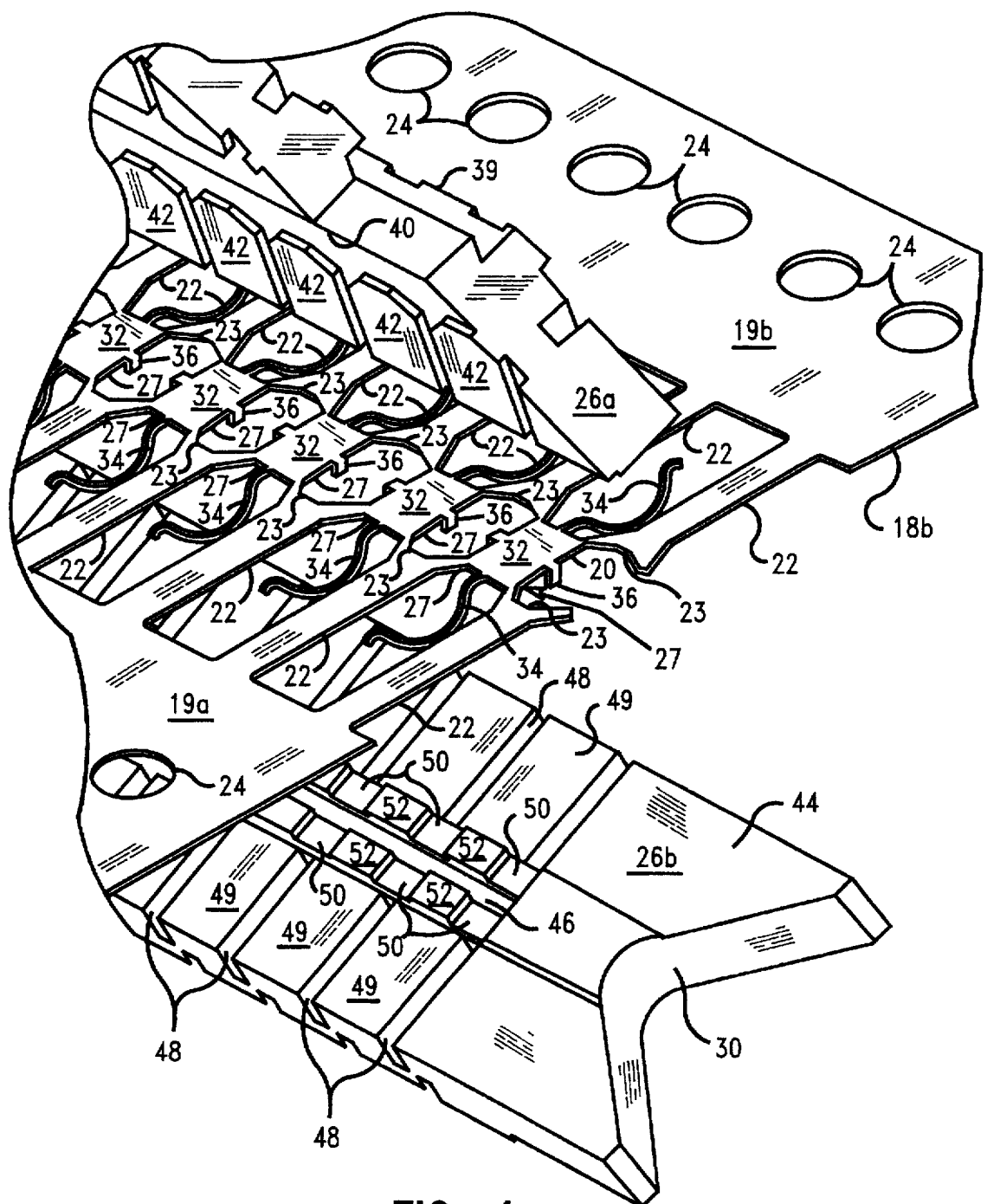
FIG. 4 is a partial, perspective view illustrating the interconnection between the carrier strip and rails depicted in FIG. 3.

To simplify the ensuing discussion of carrier strips 18a–d, only carrier strip 18b is described. However, the remaining carrier strips 18a, c and d are identically constructed. In a preferred embodiment, carrier strip 18b is fabricated from beryllium copper and is produced via industry standard stamping techniques. Referring to FIGS. 1, 3 and 4, carrier strip 18b comprises pair of coplanar body portions 19a and 19b, a plurality of equidistantly spaced ties 22 extending from body portions 19a and 19b and a plurality of contacts 20 contiguous with corresponding ties 22. Each tie 22 extends to distal end 23 and is substantially "Y" shaped. Distal end 23 of each tie is contiguous to corresponding contacts 20 at the area designated by numeral 27 thereby defining a point of contiguity. Each contact 20 is contiguous with a corresponding group of four (4) tie strips. The point of contiguity becomes discontiguous when a force of a predetermined magnitude is applied thereto. In order to accomplish, ties 22 are designed with a "weakened" section located at the areas designated by numeral 27 to form break-away points. If the thickness of the material used to fabricate carrier strip 18b is 0.004 inch or greater, it is highly preferable to form the "weakened" sections with a "score". When the thickness of the material used to fabricate carrier strip 18b is 0.003 inch or less, it is preferred that the "weakened" section be created by an "offset". It has been found that when the material has a thickness of 0.003 inch or less, it becomes very difficult to control the depth and sharpness of a "score" mark with industry standard stamping techniques. "Offsets" provide break-away points that have sufficient strength to withstand handling and processing in subsequent operations, e.g. plating, without breakage.

Each contact 20 comprises central portion 32, leads 34 that extend from central portion 32 and tabs 36 that extend downward from central portion 32. The purpose of tab 36 will be discussed below. Contacts 20 are set on the pitch required by the product for which they will be used, e.g. 1.27 mm, 1 mm, etc. Carrier strip 18b is formed from a significantly longer or continuous carrier strip. Specifically, the longer carrier strip is cut to form a carrier strip having a desired length which is determined by the required number of contacts 22. For example, if probe assembly 10 is to be used with electronic modules or test boards having a 33 ×33 array of contacts, then each carrier strip 18a–d will have a length that provides 33 contacts.

Referring to FIGS. 1 and 4, probe assembly 10 of the present invention includes rails or contact receiving members 26a–d. Probe system 10 uses at least two rails and one (1) carrier strip positioned between the rails. Each rail 26a–d is configured to support or hold one row of contacts or probes. Each rail 26a–d is movably mounted to the frame portions 12b and 12d via substantially "V" shaped rail ends or female formations that receive complimentary substantially "V" shaped surfaces or male formations 16 of frame side portions 12b and 12d. For example, "V" shaped rail ends 30 of rail 26a are slidably mounted to "V" shaped surface 16 of frame side portion 12b and the "V" shaped surface (not shown) of frame side portion 12d. Bottommost rail 26d is also supported by frame portion 12c.

Probe assembly 10 is shown in the drawings to use more than two rails. However, to simplify the ensuing discussion, only rails 26a and 26b are discussed below. Furthermore, it is to be understood that all rails are identically constructed. Each rail has a top surface adapted for receiving the equidistantly spaced ties and contacts of the carrier strip positioned above the rail. Each rail has a bottom surface that is configured to forcibly contact the ties 22 when the rails and carrier strip located therebetween is subjected to a predetermined compressive force so as to break the points of contiguity. Specifically and referring to FIG. 4, rail 26a has top portion 39 and bottom portion 40. Equidistantly spaced regions or projections 42 extend or project from bottom portion 40 and are aligned to contact tie strips 22. Top surface 44 of rail 26b has a longitudinally extending channel 46 that receives tabs 36 of contacts 20. Top surface 44 also has channels 48 that are substantially perpendicular to longitudinal channel 46 and which receive contact leads 34. Channels 48 separate surfaces 49 which are aligned with ties 22 and regions 42. Top surface 44 further includes depressions 50 separated by raised areas 52. Depressions 50 receive central portions 32 of contacts 20.

When carrier strip 18b is positioned on rail 26b: (i) central portion 32 of each contact 20 is disposed within depressions 50, (ii) tab 36 of each contact 20 is disposed in channel 46, (iii) leads 34 of each contact 20 are disposed in channels 48 and ties 22 are positioned over but do not contact surfaces 44. When rail 26a is positioned on top of carrier strip 18b, regions 42 are positioned over and contacts ties 22. When rails 26a, 26b and carrier strip 18b are subjected to a predetermined compressive force, regions 42 force ties 22 downward thereby breaking each point of contiguity 27 at the offset or score point. Thus, the tie strips 22 are "snapped off" contacts 22 when the appropriate compressive force is applied to the rails 26a and 26b. Regions 42 of rail 26a and surfaces 49 of rail 26b are configured to provide adequate clearance so tie strips 22, once "snapped off", may be subsequently removed without becoming trapped between the rails 26a and 26b. Openings 24a are provided in body portions 19a and 19b to facilitate removing tie strips 22 once snapped off the contacts 22. Openings 24a also facilitate handling the carrier strip during stamping and plating operations.

Referring to FIG. 3, each rail 26a–d is preferably fabricated from molded plastic. However, the rails may also be machined with the required features and the appropriate pitch to contain the probes or contacts 22 and their locating tabs 36. The rails may be fabricated in continuous strips and cut to required length or molded or insert molded to required length based on the required number of probes or contacts 22. Each rail has an overall thickness that is equal to the required probe pitch thereby permitting the rails to be stacked one upon the other until the desired array size is achieved.

Referring to FIG. 1, the carrier strips 18a–d and rails 26a–d, are contained within frame 12. Frame 12 comprises top portion 12a, bottom portion 12c and side portions 12b and 12d. Side portions 12b, 12d and bottom 12c define a substantially "U" shaped configuration. Top portion 12a is removably secured to the top of the "U" by the cooperation of tongues 60, channels 62 and corresponding screws, pins or other fasteners (not shown) which are inserted into openings 64, 65. During the assembly of probe assembly 10, frame 12 is secured to a fixturing device (not shown) via openings 66 in frame side portions 12b and 12d.

The shape and design of frame 12 facilitates handling a plurality of probes or contacts 22 and interconnecting electronic modules and test modules. Although frame 12, when completely assembled, has a substantially square or rectangular shape, the frame may be configured to have other shapes. Frame 12 is preferably fabricated from molded plastic. In a preferred embodiment, frame portions 12b, 12c and 12d comprise one (1) molded unit. Each portion of frame 12 may also be machined to have the required characteristics described above. The size of frame 12 may be varied in order to provide a specific array size for use in a particular application.

The preferred method of assembling probe system 10 of the present invention will now be discussed. The first step entails fixturing the "U" portion of frame 12, i.e. frame portions 12b, 12d and 12c, via a fixturing device to facilitate automated or manual assembly of probe system 10. Next, the finished rails, either molded or machined to have the desired configurations, are cut to a desired length based upon the number of required contacts 20. Alternately, the rails may be configured to have the desired length during the molding or machining process. The next step entails automatically or manually mounting the first rail (rail 26d in FIG. 1) onto frame side portions 12b and 12d. The next step entails cutting a continuous carrier strip to form carrier strip 18d. The length of the carrier strip, as with rail 26d, is based on the number of required probes or contacts 20 in the array. Next, strip 18d is automatically or manually placed on rail 26d. Since carrier strip 18d contains a plurality of contacts 20, all contacts 20 are simultaneously positioned upon the top portion of rail 26d as opposed to inserting contacts 20 individually as with conventional probe assemblies. Next, rail 26c is mounted onto frame side portions 12b and 12d. Carrier strip 18c is then positioned upon rail 26d. The steps above are repeated until an array having the desired size is completed.

The tie strips may be "snapped-off" at the offset or score by either two methods. The first method is to apply a force to each rail after it is positioned on top of a carrier strip so that the bottom portion of the rail forcibly contacts the strip ties such that the points of contiguity become discontiguous. The loose tie strips may then be removed. The second method is to position all carrier strips and rails within the frame and then apply a force to the top rail such that the points of contiguity of all carrier strips become discontiguous. The loose tie strips are then removed and top frame portion 12a is then attached to frame side portions 12b and 12d.

Thus, probe assembly 10 of the present invention achieves the objects of the invention discussed above by providing the following significant features and advantages:

a) may be configured in different sizes to facilitate utilization in specific applications thereby allowing flexibility in application design;

b) uses carrier strips that may be fabricated via industry stamping techniques;

c) provides simultaneous placement within the frame of all contacts of a row of the array thereby providing consistent placement of contacts and substantially reducing the possibility of faulty connections;

d) provides a "snap off" feature that allows the automatic removal of all tie strips;

e) may be assembled manually or by an automated manufacturing system;

f) costs less to manufacture than conventional probe assemblies; and g) may be assembled in less time than conventional probe assemblies thereby improving probe assembly production yields.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

1. A probe assembly comprising:

a frame;

at least one contact carrier within the frame, the carrier having a plurality of tie strips and a plurality of contacts, each contact being contiguous with a corresponding group of tie strips, each contact becoming discontiguous from the corresponding group of tie strips when a force is applied to the tie strips; and at least two rails attached to the frame, each rail having a top portion for receiving the contacts and tie strips and a bottom portion having a plurality of regions for contacting the tie strips, the carrier being positioned between the top portion of one of the rails and the bottom portion of the other rail, when a compressive force is applied to the rails and carrier, the regions forcibly contact the tie strips such that all the contacts simultaneously become discontiguous from the tie strips.

2. The probe assembly as set forth in claim 1 wherein the contact carrier comprises a pair of coplanar body portions, the plurality of tie strips comprising a first plurality extending from one of the body portions and a second plurality of tie strips extending from the other body portion, each tie strip extending to a distal end, the contacts being located between and contiguous to the distal ends of the first and second plurality of tie strips.

3. The probe assembly as set forth in claim 2 wherein the group of tie strips contiguous to each contact comprises a pair of tie strips of the first plurality of tie strips and a pair of tie strips of the second plurality of tie strips.

4. The probe assembly as set forth in claim 1 wherein each contact comprises:

a central portion;

a pair of leads, each lead extending from the central portion; and a pair of tabs extending downward from the central portion.

5. The probe assembly as set forth in claim 4 where the top portion of each rail comprises a longitudinal channel extending the length of the rail for receiving tabs, a plurality of smaller channels substantially perpendicular to and on either side of the longitudinal channel for receiving the leads of the contacts, and a plurality of depressions for receiving the central portions of the contacts.

6. The probe assembly as set forth in claim 1 wherein the top portion of each rail has a tie strip receiving surface aligned with the tie strips and regions.

7. The probe assembly as set forth in claim 6 wherein when the compressive force is applied to the rails and the carrier, the regions and tie strip receiving surfaces remain separated by a predetermined amount of space to allow for the removal of the tie strips once each contact becomes discontiguous with the corresponding group of tie strips.

8. The probe assembly as set forth in claim 1 wherein each rail is slidably mounted to the frame.

9. The probe assembly as set forth in claim 1 wherein the frame comprises a pair of frame side portions, each side portion having a male formation extending along the longitudinal length and facing the male formation of the other side portion, each rail end defining a female formation for receiving the male formation of a corresponding side portion.

10. The probe assembly as set forth in claim 1 further comprising means on the frame for retaining the frame in a fixed position.

11. The probe assembly as set forth in claim 1 wherein each point of contiguity between a contact and one of the tie strips of the corresponding group of tie strips includes an offset formed in the material of the carrier strip.

12. A probe assembly comprising:

a frame;

a plurality of contact carriers within the frame, each contact carrier having a plurality of tie strips and a plurality of contacts, each contact being contiguous with a corresponding group of tie strips, each contact becoming discontiguous from the corresponding group of tie strips when a force is applied to the tie strips; and a plurality of rails movably mounted to the frame, each rail having a top portion for receiving the contacts and a bottom portion having a plurality of regions for contacting the tie strips, the top portion of each rail further including a tie strip receiving surface aligned with a corresponding tie strip and region, the carriers and rails being alternately arranged such that each carrier is positioned between the top portion of one of the rails and the bottom portion of another rail, when a compressive force is applied to the rails and carriers, the regions forcibly contact the tie strips such that all the contacts simultaneously become discontiguous from the group of tie strips, the regions and tie strip receiving surfaces being separated by a predetermined amount of space to allow for the removal of the tie strips once each contact becomes discontiguous with the corresponding group of tie strips.

* * * * *